US012796282B2

(12) United States Patent
Kim et al.

(10) Patent No.: US 12,796,282 B2
(45) Date of Patent: Nov. 10, 2026

(54) DISPLAY DEVICE

(71) Applicant: SAMSUNG DISPLAY CO., LTD., Yongin-si (KR)

(72) Inventors: Youngji Kim, Yongin-si (KR); Dongjo Kim, Yongin-si (KR); Sunyoung Kim, Yongin-si (KR); Hyun Kim, Yongin-si (KR); Seungmin Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 439 days.

(21) Appl. No.: 18/384,917

(22) Filed: Oct. 30, 2023

(65) Prior Publication Data

US 2024/0215377 A1 Jun. 27, 2024

(30) Foreign Application Priority Data

Dec. 26, 2022 (KR) ........................ 10-2022-0185055

(51) Int. Cl.
*H10K 59/80* (2023.01)

(52) U.S. Cl.
CPC .................................... *H10K 59/80* (2023.02)

(58) Field of Classification Search
CPC ...................................................... H10K 59/80
USPC ............................................................ 257/72
See application file for complete search history.

(56) References Cited

U.S. PATENT DOCUMENTS 9,966,546 B2 5/2018 Shirahata et al.
11,877,502 B2 * 1/2024 Li ........................... B32B 25/00
2016/0204366 A1 * 7/2016 Zhang .................. H10K 77/111 257/40
2020/0310577 A1 * 10/2020 Jeon .................... H04M 1/0266
2022/0102468 A1 * 3/2022 Lee ...................... H10K 59/131
2022/0181576 A1 * 6/2022 Cha ........................ H05K 1/028
2024/0258481 A1 * 8/2024 Kim .................. G02F 1/133305

FOREIGN PATENT DOCUMENTS

KR 20180005313 A * 1/2018 ............. H10K 50/86
KR 10-2096221 3/2020
KR 10-2020-0082363 7/2020
KR 10-2020-0130571 11/2020

OTHER PUBLICATIONS

KR-20180005313-A; Choi Yoon Sun, Jan. 16, 2018.*

* cited by examiner

*Primary Examiner* — Igwe U Anya
(74) *Attorney, Agent, or Firm* — F. CHAU & ASSOCIATES, LLC

(57) ABSTRACT

A display device including: a display panel including a display area, a pad area spaced apart from the display area, and a bending area between the display area and the pad area; a first support part overlapping the display area; and a second support part overlapping the pad area, wherein the second support part is spaced apart from the first support part in a first direction when the bending area is bent, and wherein a first end of the first support part adjacent to the bending area and a first end of the second support part adjacent to the bending area are spaced apart from each other by about 0.4 mm or less in a second direction crossing the first direction when the bending area is bent.

20 Claims, 10 Drawing Sheets

DISPLAY DEVICE

CROSS-REFERENCE TO RELATED APPLICATION(S)

This application claims priority under 35 U.S.C. § 119 to Korean Patent Application No. 10-2022-0185055 filed on Dec. 26, 2022 in the Korean Intellectual Property Office (KIPO), the disclosure of which is incorporated by reference herein in its entirety.

1. TECHNICAL FIELD

Embodiments of the disclosure relate to a display device. More particularly, embodiments of the disclosure relate to a flexible display device.

2. DESCRIPTION OF THE RELATED ART

As information technology continues to advance, the significance of display devices as a means of connecting users with information is becoming increasingly apparent. Various types of display devices such as a liquid crystal display device (LCD), an organic light emitting display device (OLED), a plasma display device (PDP), a quantum dot display device or the like, are being employed more frequently.

On the other hand, bending a portion of the display device offers potential benefits such as improved visibility from various angles or an area of a non-display area may be reduced. However, in the manufacturing process of such a display device, there is a need to minimize defects.

The display device may include a support member for providing structural support. The support member may include a first support part, which supports a display area, and a second support part, which supports a pad area. If the distance between one end of the first support part and one end of the second support part exceeds a predetermined distance, cracks may form in a bending area of the display device.

SUMMARY

Embodiments of the disclosure provide a display device with improved reliability.

A display device according to embodiments of the disclosure includes a display panel including a display area, a pad area spaced apart from the display area, and a bending area between the display area and the pad area; a first support part overlapping the display area; and a second support part overlapping the pad area, wherein the second support part is spaced apart from the first support part in a first direction when the bending area is bent, and wherein a first end of the first support part adjacent to the bending area and a first end of the second support part adjacent to the bending area are spaced apart from each other by about 0.4 mm or less in a second direction crossing the first direction when the bending area is bent.

Each of the first support part and the second support part includes glass.

The first support part and the second support part overlap each other and face each other when the bending area is bent.

The display device may further include a driving integrated circuit disposed on the display panel and overlapping the pad area.

The display device may further include a printed circuit board connected to the display panel in the pad area.

The display device may further include a functional layer disposed between the first support part and the second support part.

The display panel includes a first surface contacting the first and second support parts and a second surface opposite to the first surface.

Each of a side surface of the first end of the first support part and a side surface of the first end of the second support part has a tapered shape.

Each of a side surface of the first end of the first support part and a side surface of the first end of the second support part is perpendicular to the first surface of the display panel.

Each of the first end of the first support part and the first end of the second support part includes at least two surfaces extending in different directions from each other.

Each of the side surface of the first end of the first support part and the side surface of the first end of the second support part has a curved shape.

The display device may further include a polarization layer disposed on the display panel and overlapping the display area.

The display device may further include an adhesive layer disposed on the polarization layer and overlapping the display area.

The display device may further include a window member disposed on the adhesive layer and overlapping the display area.

The display device may further include a bending protection layer disposed on the display panel and overlapping the bending area.

The display device may further include a substrate extending from the display area to the pad area.

The substrate includes an organic material.

The display panel further includes: a circuit element layer disposed in the display area on the substrate and including at least one transistor; a light emitting diode layer disposed in the display area on the circuit element layer and including at least one light emitting diode; and an encapsulation layer disposed on the light emitting diode layer.

A display device according to embodiments of the disclosure includes a display panel including a display area, a pad area, and a bending area between the display area and the pad area; a first support part disposed on the display panel and overlapping the display area; and a second support part disposed on the display panel and overlapping the pad area, wherein the second support part is spaced apart from the first support part in a second direction when the display panel is in a flat state, and when the display panel is bent the first support part and the second support part face each other in a first direction crossing the second direction and a first end of the first support part adjacent to the bending area and a first end of the second support part adjacent to the bending area are spaced apart from each other by about 0.4 mm or less in the second direction.

In the display device according to embodiments of the disclosure, the one end of the first support part and the one end of the second support part that are adjacent to each other may be spaced apart from each other by about 0.4 mm or less in the second direction. Therefore, when the display device is bent, stress applied to the bending area can be alleviated. This reduction in stress can prevent the occurrence of cracks in components included in the display device. Accordingly, the reliability of the display device is enhanced.

DETAILED DESCRIPTION OF THE EMBODIMENTS

Figure 1:
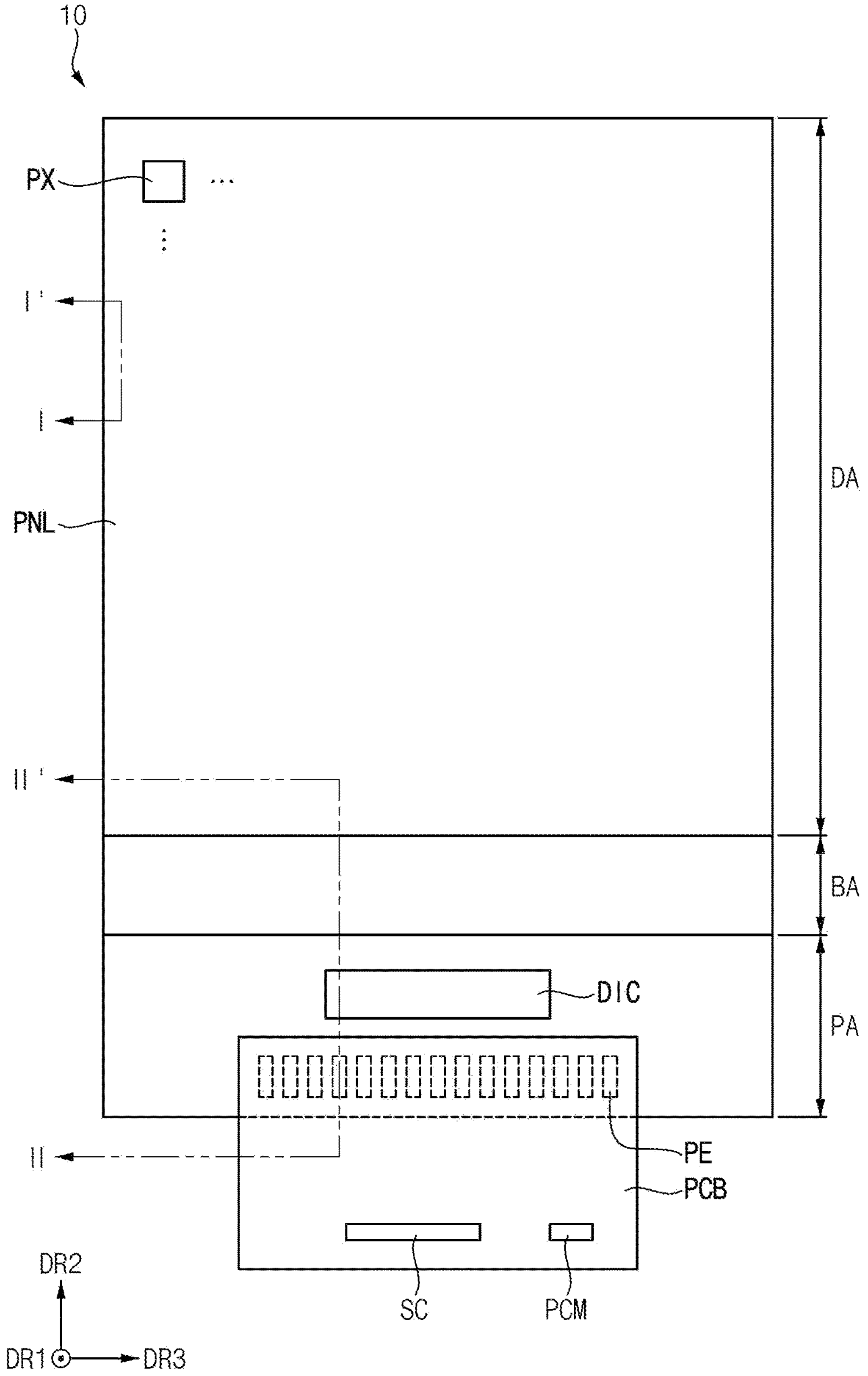
FIG. 1 is a plan view illustrating a display device according to an embodiment of the disclosure.

Hereinafter, embodiments of the disclosure will be described in more detail with reference to the accompanying drawings. The same reference numerals may be used for the same components in the drawings, and thus, redundant descriptions of the same components may be omitted.

Figure 2:
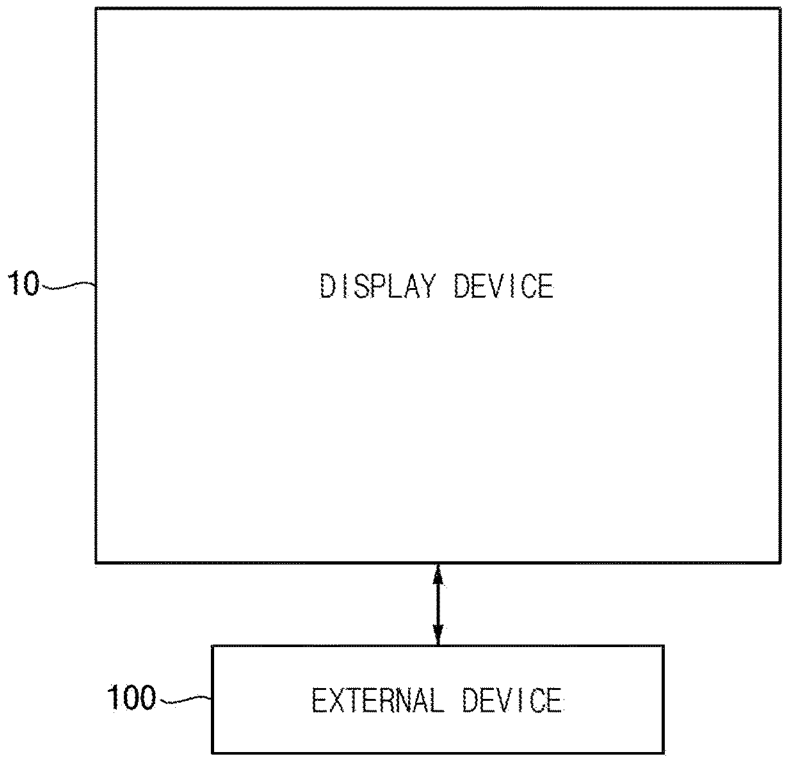
FIG. 2 is a block diagram illustrating an external device electrically connected to the display device of FIG. 1.

FIG. 1 is a plan view illustrating a display device according to an embodiment of the disclosure. FIG. 2 is a block diagram illustrating an external device electrically connected to the display device of FIG. 1.

For example, a display device 10 shown in FIG. 1 is in a state before a display panel PNL is bent.

Referring to FIG. 1, the display device 10 according to an embodiment of the disclosure may include the display panel PNL, a driving integrated circuit DIC, a printed circuit board PCB, a signal control circuit SC, and a power control module PCM. Here, the display panel PNL may include pad electrodes PE and a plurality of pixels PX.

The display panel PNL may include a display area DA, a bending area BA, and a pad area PA. The pad area PA may be spaced apart from the display area DA. For example, the pad area PA may be spaced apart from one side of the display area DA in a direction opposite to a second direction DR2 parallel to an upper surface of the display panel PNL. For example, the pad area PA may be spaced apart from a first side of the display area DA. In other words, the pad area PA may be spaced apart from the display area DA in a plan view. The bending area BA may be positioned between the display area DA and the pad area PA in a plan view. In addition, the bending area BA may be bent from the display area DA.

Referring further to FIG. 2, an external device 100 may be electrically connected to the display device 10. For example, the external device 100 may be electrically connected to the display device 10 through the printed circuit board PCB. The external device 100 may generate electrical signals, voltages, or the like to display images on the display panel PNL.

The pad electrodes PE may be disposed in the pad area PA. The pad electrodes PE may be spaced apart from each other in a third direction DR3. Here, the third direction DR3 may be a direction substantially parallel to an upper surface of the display device 10. The third direction DR3 may be substantially perpendicular to the second direction DR2. Some of the pad electrodes PE may be connected to the driving integrated circuit DIC through a line, and some of the pad electrodes PE may be connected to the plurality of pixels PX through a line. For example, each of the pad electrodes PE may include a metal, an alloy, a metal nitride, a conductive metal oxide, a transparent conductive material, or the like. These may be used alone or in combination with each other.

The printed circuit board PCB may be connected to the display panel PNL in the pad area PA. For example, one end of the printed circuit board PCB may be electrically connected to the pad electrodes PE of the display panel PNL. In other words, a first end of the printed circuit board PCB may be electrically connected to the pad electrodes PE. The other end of the printed circuit board PCB may be electrically connected to the external device 100. In other words, a second end of the printed circuit board PCB may be electrically connected to the external device 100. This way, the electrical signal, the voltage, or the like generated by the external device 100 may be provided to the driving integrated circuit DIC and the plurality of pixels PX through the printed circuit board PCB.

Components for receiving the electrical signals or the voltages supplied from the external device 100 and transmitting the received electrical signals or the voltages to the display panel PNL may be disposed on the printed circuit board PCB. For example, the signal control circuit SC for controlling the electrical signals provided to the display panel PNL may be disposed on the printed circuit board PCB. In addition, the power control module PCM for controlling the voltages provided to the display panel PNL may be disposed on the printed circuit board PCB.

The driving integrated circuit DIC may be disposed on the display panel PNL. The driving integrated circuit DIC may overlap the pad area PA. The driving integrated circuit DIC may convert a digital data signal among the electrical signals into an analog data signal and provide a converted analog data signal to the plurality of pixels PX. For example, the driving integrated circuit DIC may be a data driver. Alternatively, the display device 10 may further include a gate driver. In this case, the gate driver may be disposed on the one side of the display area DA. The display device 10 may also include an emission driver that may be disposed on one or more sides of the display area DA.

The plurality of pixels PX may be disposed in the display area DA. Each of the plurality of pixels PX may emit light. The plurality of pixels PX may be arranged in the second and third directions DR2 and DR3 in the display area DA. Here, the third direction DR3 may be substantially orthogonal to the second direction DR2. The lines connected to the plurality of pixels PX may be further disposed in the display area DA. For example, the lines may include a data signal line, a gate signal line, and a power line.

Although each shape of the display area DA, the bending area BA, and the pad area PA of the disclosure is illustrated in FIG. 1 as having a rectangular planar shape, the disclosure is not limited thereto. For example, each of the display area DA, the bending area BA, and the pad area PA may have a triangular planar shape, a rhombic planar shape, a circular planar shape, a track-shaped planar shape, an elliptical shape, or the like.

In addition, in FIG. 1, a structure of the driving integrated circuit DIC may be a chip on plastic (COP) structure in which the driving integrated circuit DIC disposed on the display panel PNL or chip on glass (COG) structure. However, the disclosure is not limited thereto. For example, the driving integrated circuit DIC may have a chip on film structure in which the driving integrated circuit DIC is disposed on a flexible film. In this case, the printed circuit board PCB may be electrically connected to the flexible film.

Figure 3:
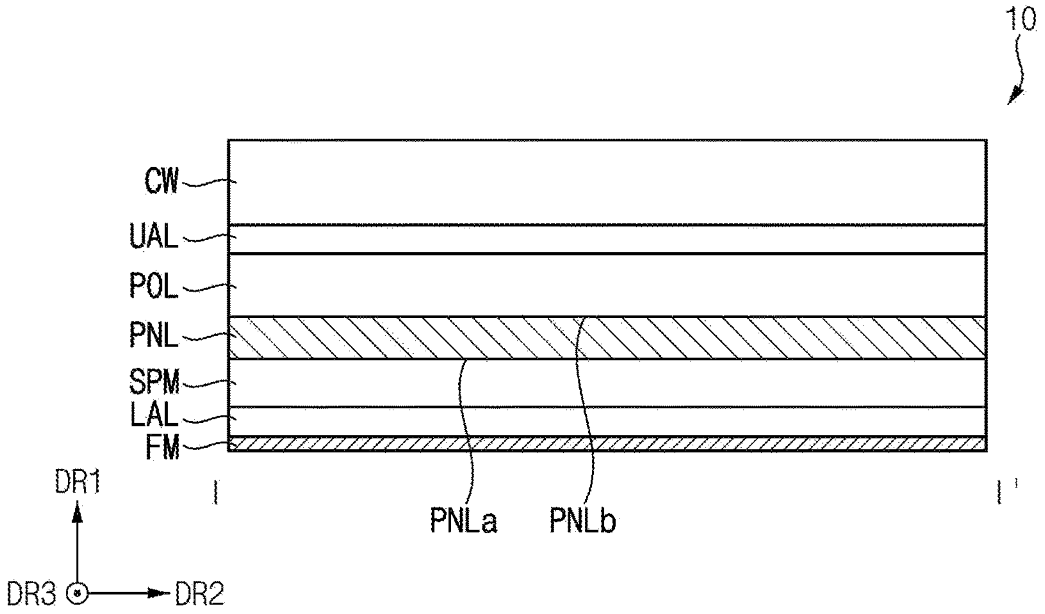
FIG. 3 is a cross-sectional view taken along line I-I' of FIG. 1.

FIG. 3 is a cross-sectional view taken along line I-I' of FIG. 1.

Referring to FIG. 3, the display device 10 may include a polarization layer POL, an upper adhesive layer UAL, a window member CW, a support member SPM, a lower adhesive layer LAL, and a functional layer FM.

The polarization layer POL may be disposed on the display panel PNL. For example, the polarization layer POL may be disposed on a second surface PNLb of the display panel PNL. The polarization layer POL may reduce reflection of external light of the display device 10. For example, the external light may pass through the polarization layer POL, be reflected from a lower portion of the polarization layer POL (e.g., the display panel PNL), and then pass through the polarization layer POL again. In this case, a phase of the external light may change as the external light passes through the polarization layer POL twice. As a consequence, since a phase of the reflected light is different from a phase of an incident light entering the polarization layer POL, destructive interference may occur. Accordingly, visibility of the display device 10 may be improved by reducing reflection of the external light.

The upper adhesive layer UAL may be disposed on the polarization layer POL. The upper adhesive layer UAL may connect the polarization layer POL and the window member CW. For example, the upper adhesive layer UAL may include a pressure sensitive adhesive (PSA), an optically clear adhesive (OCA), an optically clear resin (OCR), or the like.

The window member CW may be disposed on the upper adhesive layer UAL. The window member CW may protect the display panel PNL from external impurities, impact or the like. In an embodiment, the window member CW may include flexible transparent glass or transparent plastic. For example, the window member CW may include ultra-thin glass (UTG), polyimide (PI), or the like. When the display device 10 is bent, the flexible window member CW may also be bent. Functional layers such as an anti-reflection layer, a hard-coating layer, and an anti-fingerprint layer may be disposed on the window member CW.

A window protection layer may be additionally disposed on the window member CW. The window protection layer may protect the window member CW from the external impurities, the impact, or the like.

The support member SPM may be disposed under the display panel PNL. The support member SPM may absorb an external impact from the lower portion of the display device 10. Accordingly, the support member SPM may protect a first surface PNLa of the display panel PNL from the external impact.

The lower adhesive layer LAL may be disposed under the support member SPM. The lower adhesive layer LAL may connect the support member SPM and the functional layer FM. For example, the lower adhesive layer LAL may include pressure sensitive adhesive (PSA), optically clear adhesive (OCA), optically clear resin (OCR), or the like.

The functional layer FM may be disposed under the lower adhesive layer LAL. The functional layer FM may include a digitizer, a heat dissipation layer, a cushion layer, or the like.

For example, the digitizer may be a device that converts coordinates of an input unit into digital data when the input unit, such as a pen, touches the window member CW. The digitizer may operate using an electromagnetic resonance method.

For example, the heat dissipation layer may dissipate heat transmitted to the first surface PNLa of the display panel PNL. The heat dissipation layer may include a material having high thermal conductivity. For example, the heat dissipation layer may include graphite. Alternatively, the heat dissipation layer may include aluminum (Al), an alloy containing aluminum (Al), copper (Cu), an alloy containing copper (Cu), silver (Ag), an alloy containing silver (Ag), or the like. These may be used alone or in combination with each other.

The cushion layer may be disposed under the display panel PNL to mitigate the impact of the display panel PNL. For example, the cushion layer may include a material capable of buffering by containing air, such as a cushion or a sponge.

In addition, the functional layer FM may include acrylic resin, polyurethane, thermoplastic polyurethane, latex, polyurethane foam, polystyrene foam, or the like. These may be used alone or in combination with each other.

Adhesive layers may be disposed between the display panel PNL and the support member SPM and between the display panel PNL and the polarization layer POL, respectively. The adhesive layers may include pressure sensitive adhesive (PSA), optically clear adhesive (OCA), optically clear resin (OCR), or the like.

Figure 4:
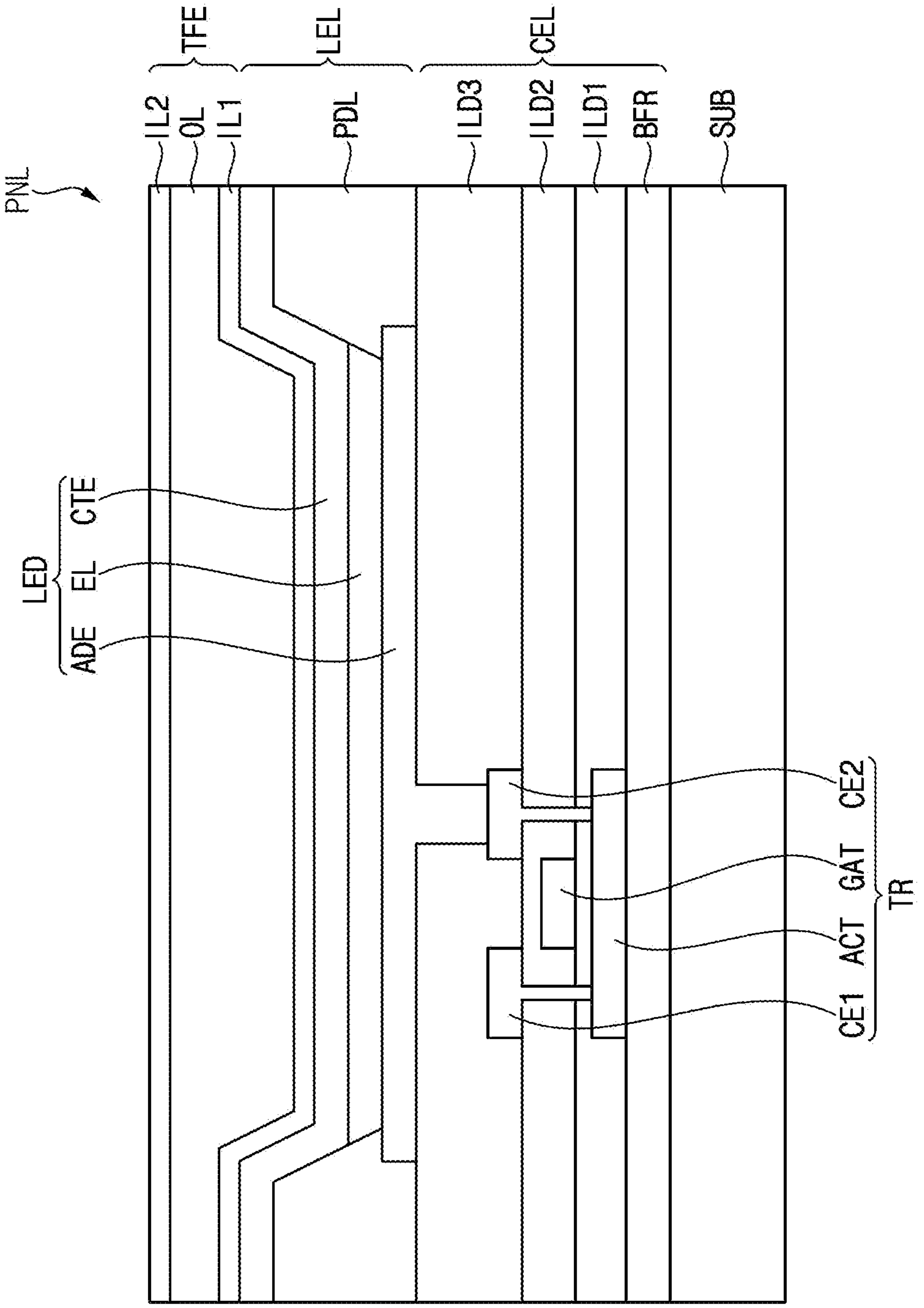
FIG. 4 is a cross-sectional view illustrating the display panel included in the display device of FIG. 3.

FIG. 4 is a cross-sectional view illustrating the display panel included in the display device of FIG. 3.

Referring to FIGS. 1 and 4, the display panel PNL may include a substrate SUB, a circuit element layer CEL, a light emitting diode layer LEL, and an encapsulation layer TFE. The circuit element layer CEL may be disposed in the display area DA on the substrate SUB. The circuit element layer CEL may include a buffer layer BFR, at least one transistor TR, a first insulating layer ILD1, a second insulating layer ILD2, and a third insulating layer ILD3. The light emitting diode layer LEL may be disposed in the display area DA on the circuit element layer CEL. The light emitting diode layer LEL may include at least one light emitting diode LED and a pixel defining layer PDL. The encapsulation layer TFE may be disposed on the light emitting diode layer LEL.

The transistor TR may include an active pattern ACT, a gate electrode GAT, a first connection electrode CE1, and a second connection electrode CE2. The transistor TR may be electrically connected to the pad electrodes PE of FIG. 1. The light emitting diode LED may include a pixel electrode ADE, a light emitting layer EL, and a common electrode CTE.

The substrate SUB may be formed of a transparent or opaque material. For example, the substrate SUB may be formed of a glass, a quartz, a plastic, or the like. For example, plastics that may be used as the substrate SUB include polyethylene terephthalate (PET), polyimide (PI), polyether sulfone (PES), polyacrylate (PAR), polyetherimide (PEI), polyethylene naphthalate (PEN), polyphenylene sulfide (PPS), polyarylate, polycarbonate (PC), poly arylene ether sulfone, or the like. In this case, the substrate SUB may include a plurality of polyimide layers and barrier layers disposed between the polyimide layers.

The buffer layer BFR may be disposed on the substrate SUB. In an embodiment, the buffer layer BFR may include an inorganic material. For example, the materials that may be used as the buffer layer BFR may include silicon oxide, silicon nitride, silicon oxynitride, or the like. These may be used alone or in combination with each other.

The buffer layer BFR may prevent diffusion of metal atoms or impurities from the substrate SUB into the active pattern ACT. In addition, the buffer layer BFR may control a heat supply rate during a crystallization process for forming the active pattern ACT.

The active pattern ACT may be disposed on the buffer layer BFR. In an embodiment, the active pattern ACT may be a silicon semiconductor, an oxide semiconductor, or the like. For example, the materials that may be used as the active pattern ACT may include amorphous silicon, polycrystalline silicon, metal oxide, or the like. These may be used alone or in combination with each other.

The first insulating layer ILD1 may be disposed on the active pattern ACT. In this case, the active pattern ACT may be provided between the first insulating layer ILD1 and the buffer layer BFR. The first insulating layer ILD1 may be formed of an insulating material. For example, the insulating material that may be used as the first insulating layer ILD1 may include silicon oxide, silicon nitride, silicon oxynitride, or the like. These may be used alone or in combination with each other. In an embodiment, as shown in FIG. 4, the first insulating layer ILD1 may be formed on the entirety of the buffer layer BFR to cover the active pattern ACT. However, the disclosure is not limited thereto, and in another embodiment, the first insulating layer ILD1 may be disposed on the active pattern ACT in a pattern form.

The gate electrode GAT is disposed on the first insulating layer ILD1 and may overlap the active pattern ACT. In one embodiment, the gate electrode GAT may include a metal, an alloy, a conductive metal oxide, a transparent conductive material, or the like. Examples of materials that can be used for the gate electrode GAT include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The second insulating layer ILD2 may cover the gate electrode GAT and may be disposed on the buffer layer BFR. In an embodiment, the second insulating layer ILD2 may include an inorganic insulating material. For example, the materials that may be used as the second insulating layer ILD2 may include silicon oxide, silicon nitride, silicon oxynitride, or the like. These may be used alone or in combination with each other.

The first connection electrode CE1 and the second connection electrode CE2 may be disposed on the second insulating layer ILD2. The first connection electrode CE1 and the second connection electrode CE2 may contact the active pattern ACT. The first connection electrode CE1 and the second connection electrode CE2 may include a metal such as aluminum (Al), titanium (Ti), copper (Cu), or the like.

The third insulating layer ILD3 may be disposed on the first connection electrode CE1 and the second connection electrode CE2. The third insulating layer ILD3 may include an organic insulating material such as polyimide or the like and/or an inorganic insulating material such as silicon nitride, silicon oxide, or the like. The third insulating layer ILD3 may have a multi-layer structure.

The pixel electrode ADE may be disposed on the third insulating layer ILD3. The pixel electrode ADE may be connected to the first connection electrode CE1 or the second connection electrode CE2. In FIG. 4, the pixel electrode ADE is connected to the second electrode CE2. The pixel electrode ADE may include a metal, an alloy, a conductive metal oxide, a transparent conductive material, or the like. For example, the materials that may be used as the pixel electrode ADE may include silver (Ag), an alloy containing the silver, molybdenum (Mo), an alloy containing the molybdenum, aluminum (Al), an alloy containing the aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

The pixel defining layer PDL may be disposed on the pixel electrode ADE. For example, the pixel defining layer PDL may overlap edges of the pixel electrode ADE. In an embodiment, the pixel defining layer PDL may include an organic insulating material. A pixel opening exposing an upper surface of the pixel electrode ADE may be formed in the pixel defining layer PDL.

The light emitting layer EL may be disposed on the pixel electrode ADE exposed through the pixel opening. In an embodiment, the light emitting layer EL may be separated from the light emitting layer EL of an adjacent pixel. In another embodiment, the light emitting layer EL may continuously extend on the pixel electrode ADE and the pixel defining layer PDL.

The common electrode CTE may be disposed on the light emitting layer EL. The common electrode CTE may include a conductive material such as a metal, an alloy, a conductive metal nitride, a conductive metal oxide, or a transparent conductive material. The common electrode CTE may have a single-layer structure or a multi-layer structure including a plurality of conductive layers. The light emitting layer EL may emit light based on a voltage difference between the pixel electrode ADE and the common electrode CTE.

The encapsulation layer TFE may be disposed on the common electrode CTE. The encapsulation layer TFE may include at least one inorganic encapsulation layer and at least one organic encapsulation layer. In an embodiment, the encapsulation layer TFE may include a first inorganic encapsulation layer IL1 disposed on the common electrode CTE, an organic encapsulation layer OL disposed on the first inorganic encapsulation layer IL1, and a second inorganic encapsulation layer IL2 disposed on the organic encapsulation layer OL. The encapsulation layer TFE may prevent impurities from penetrating into the light emitting diode LED.

Figure 5:
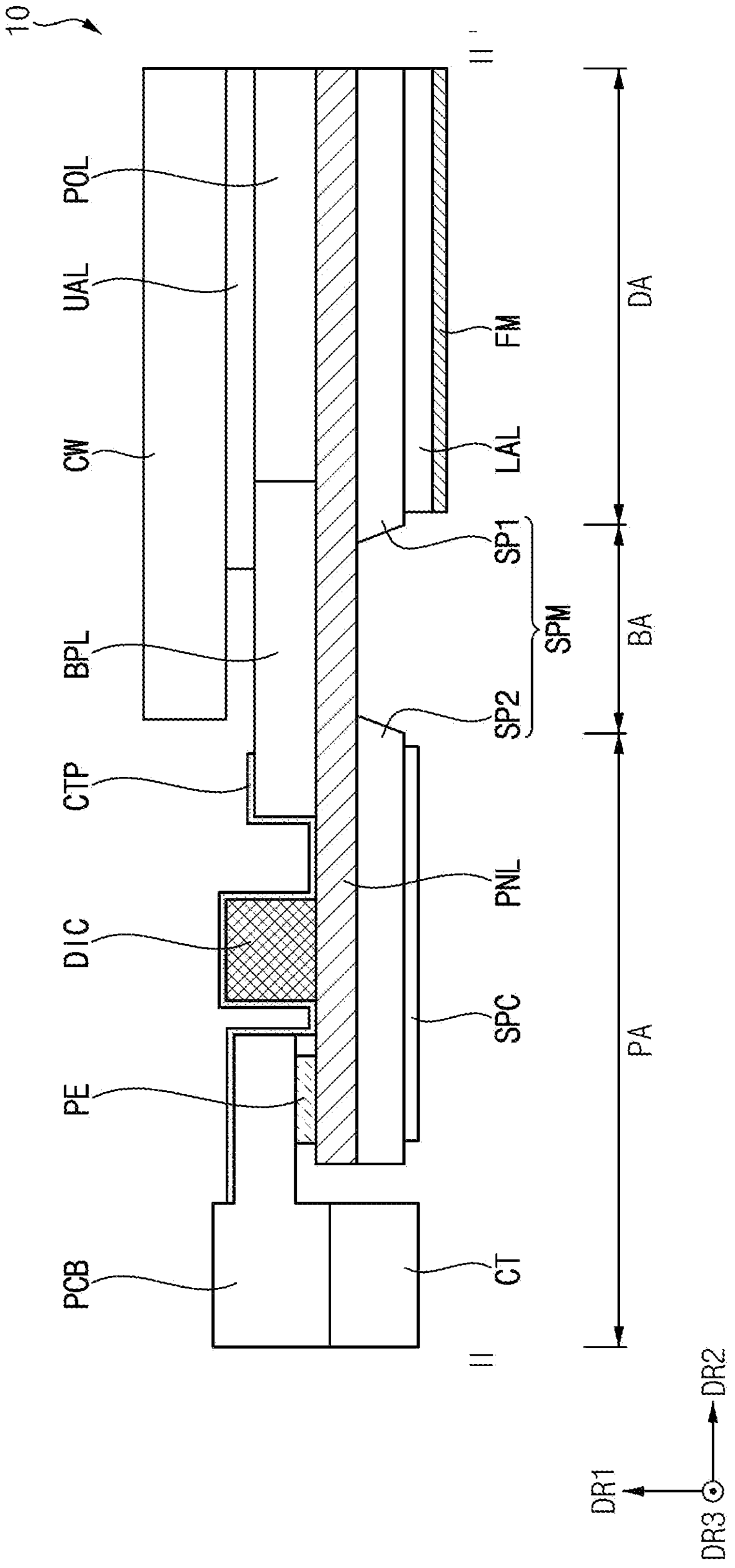
FIG. 5 is a cross-sectional view taken along line II-II' of FIG. 1.
Figure 6:
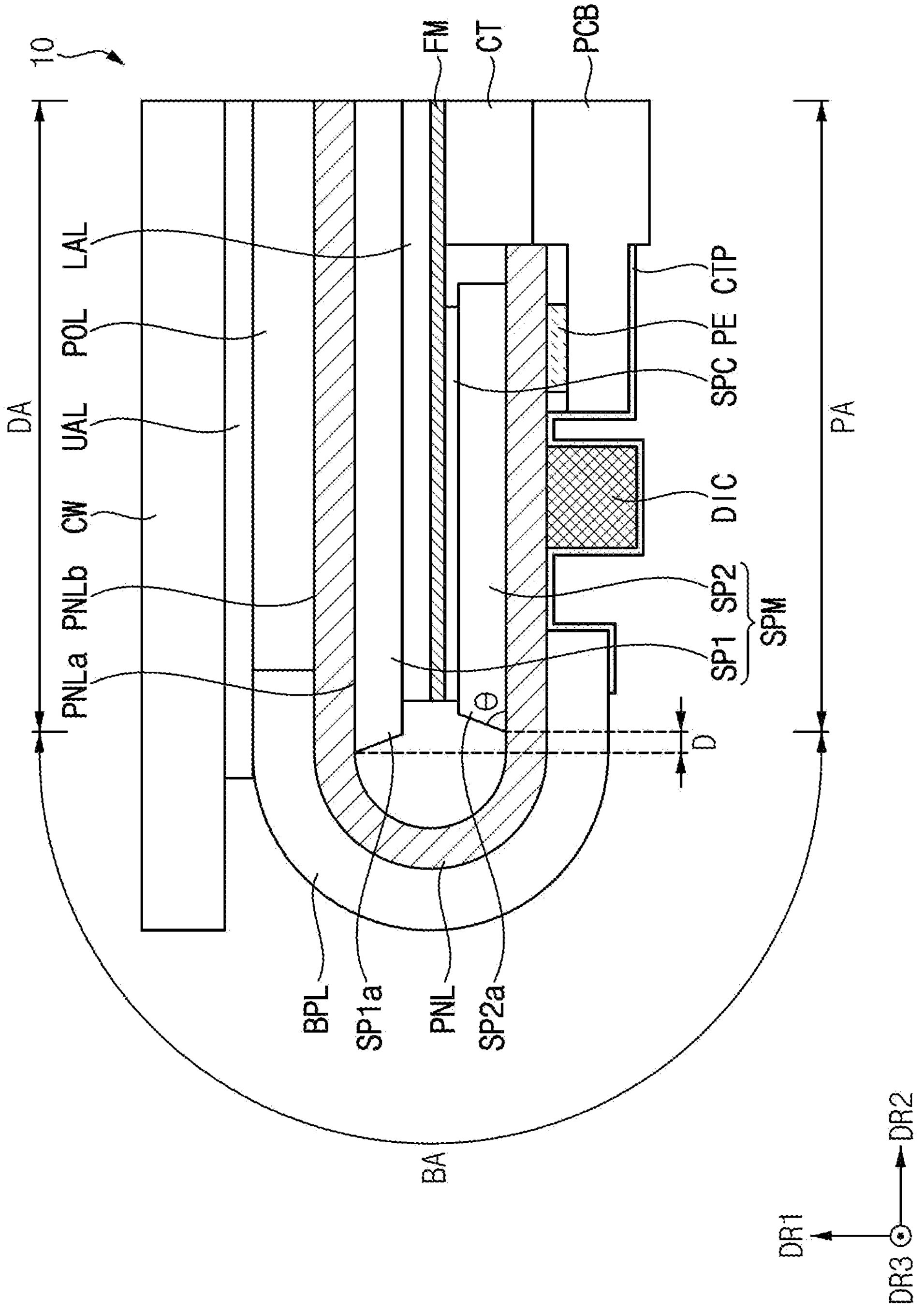
FIG. 6 is a cross-sectional view illustrating a bent shape of the display device of FIG. 5.

FIG. 5 is a cross-sectional view taken along line II-II' of FIG. 1. FIG. 6 is a cross-sectional view illustrating a bent shape of the display device of FIG. 5.

For example, the bending area BA of the display device 10 may be bent from the display area DA. The display device 10 shown in FIG. 5 is in the state before the display panel PNL is bent, and the display device 10 shown in FIG. 6 is in a state where the display panel PNL is bent. In the display device 10, a portion of the display panel PNL overlapping the bending area BA may be provided in the bent state.

Referring to FIGS. 5 and 6, the display device 10 according to an embodiment of the disclosure may include the display panel PNL, the support member SPM, the lower adhesive layer LAL, and the functional layer FM, the polarization layer POL, the upper adhesive layer UAL, the window member CW, the driving integrated circuit DIC, the printed circuit board PCB, a spacer SPC, a bending protection layer BPL, a cover tape CTP, and a conductive tape CT. Here, the display panel PNL may include the pad electrodes PE, and the support member SPM may include a first support part SP1 and a second support part SP2.

The display panel PNL may include the first surface PNLa and a second surface PNLb. The first surface PNLa may contact the support member SPM. The second surface PNLb may be a surface opposite to the first surface PNLa. For example, the second surface PNLb may contact the bending protection layer BPL. In addition, the display panel PNL may extend from the display area DA to the pad area PA. For example, the substrate SUB included in the display panel PNL may extend from the display area DA to the pad area PA. In other words, the substrate SUB overlapping the bending area BA may be bent. For example, the substrate SUB may include an organic material.

The support member SPM may be disposed on the first surface PNLa of the display panel PNL. For example, the first support part SP1 may be disposed in the display area DA on the first surface PNLa of the display panel PNL, and the second support part SP2 may be disposed in the pad area PA on the first surface PNLa of the display panel PNL. In other words, the support member SPM might not be disposed in the bending area BA on the first surface PNLa of the display panel PNL. The support member SPM may protect the first surface PNLa of the display panel PNL.

In an embodiment, the first support part SP1 may overlap the display area DA, and the second support part SP2 may overlap the pad area PA. When the display device 10 is bent, the second support part SP2 may be spaced apart from the first support part SP1 in a first direction DR1. The first direction DR1 may cross both the second direction DR2 and the third direction DR3. In other words, when the display panel PNL is bent in the bending area BA, the first support part SP1 and the second support part SP2 may face each other while overlapping each other.

In an embodiment, one end SP1*a* of the first support part SP1 adjacent to the bending area BA and one end SP2*a* of the second support part SP2 adjacent to the bending area BA may overlap each other. For example, the one end SP1*a* of the first support part SP1 adjacent to the bending area BA and the one end SP2*a* of the second support part SP2 adjacent to the bending area BA may be spaced apart from each other by about 0.4 mm or less in the second direction DR2. The separation distance of about 0.4 mm or less in the second direction DR2 between the one end SP1*a* of the first support part SP1 and the one end SP2*a* of the second support part SP2 is illustrated by D in FIG. 6. For example, both the one end SP1*a* of the first support part SP1 adjacent to the bending area BA and the one end SP2*a* of the second support part SP2 adjacent to the bending area BA may be positioned on substantially the same line in the first direction DR1. In other words, the one end SP1*a* of the first support part SP1 and the one end SP2*a* of the second support part SP2 may entirely overlap each other in the plan view but for the slight difference in distance between the two ends.

For example, the support member SPM may include a glass. In other words, each of the first support part SP1 and the second support part SP2 may include the glass. However, the disclosure is not limited thereto.

In an embodiment, each of a side surface of the one end SP1*a* of the first support part SP1 and a side surface of the one end SP2*a* of the second support part SP2 may have a tapered shape. In other words, an angle formed between the side surface of the one end SP1*a* of the first support part SP1 and the first surface PNLa of the display panel PNL may be greater than about 0 degree and less than about 90 degrees. In addition, an angle formed between the side surface of the one end SP2*a* of the second support part SP2 and the first surface PNLa of the display panel PNL may be greater than about 0 degree and less than about 90 degrees. For example, the angle formed between the side surface of the one end SP1*a* of the first support part SP1 and the first surface PNLa of the display panel PNL may be equal to about 45 degrees or more and may be equal to about 90 degrees or less. The angle formed between the side surface of the one end SP2*a* of the second support part SP2 and the first surface PNLa of the display panel PNL may be equal to about 45 degrees or more and may be equal to about 90 degrees or less. However, the disclosure is not limited thereto.

An adhesive member may be disposed between the display panel PNL and the support member SPM. The adhesive member may adhere the support member SPM to the first surface PNLa of the display panel PNL. The adhesive member may be disposed in the bending area BA.

The lower adhesive layer LAL may be disposed on a lower surface of the first support part SP1. The lower adhesive layer LAL may adhere the support member SPM and the functional layer FM. For example, the lower adhesive layer LAL may include pressure sensitive adhesive (PSA), optically clear adhesive (OCA), optically clear resin (OCR), or the like. These may be used alone or in combination with each other.

The functional layer FM may be disposed on a lower surface of the lower adhesive layer LAL. In other words, when the display device 10 is bent, the functional layer FM may be disposed between the first support part SP1 and the second support part SP2. The functional layer FM may include the digitizer, the heat dissipation layer, or the like. For example, the digitizer may be the device that converts the coordinates of the input unit into the digital data when the input unit, such as the pen, touches the window member CW. The digitizer may operate using the electromagnetic resonance method. In addition, the heat dissipation layer may dissipate the heat transmitted to the first surface PNLa of the display panel PNL. The heat dissipation layer may include the material having the high thermal conductivity. For example, the heat dissipation layer may include the graphite. Alternatively, the heat dissipation layer may include aluminum (Al), an alloy containing the aluminum (Al), copper (Cu), an alloy containing the copper (Cu), silver (Ag), an alloy containing the silver (Ag), or the like. These may be used alone or in combination with each other.

The spacer SPC may be disposed on an upper surface of the second support part SP2. As shown in FIG. 6, the spacer SPC may compensate for a step difference. Alternatively, the spacer SPC may further include an adhesive material, and the spacer SPC may be fixed to a lower surface of the functional layer FM. For example, the spacer SPC may include an organic insulating material. As another example, the spacer SPC may include polyethylene terephthalate (PET), polypropylene (PP), polycarbonate (PC), polystyrene (PS), polyethylene (PE), or the like. These may be used alone or in combination with each other.

The polarization layer POL may be disposed on the display panel PNL. The polarization layer POL may overlap the display area DA. The polarization layer POL may block the external light incident on the display device 10 from the outside.

The bending protection layer BPL may be disposed on the display panel PNL. The bending protection layer BPL may overlap the bending area BA, and may also overlap a portion of the display area DA and a portion of the pad area PA. The bending protection layer BPL may include a photo-curable resin, a thermosetting resin, or the like. For example, the bending protection layer BPL may include epoxy resin, amino resin, phenol resin, urea resin, melamine resin, unsaturated polyester resin, polyurethane resin, polyimide resin, or the like. These may be used alone or in combination with each other.

The upper adhesive layer UAL may be disposed on the polarization layer POL and the bending protection layer BPL. The upper adhesive layer UAL may overlap the display area DA, and may overlap both a portion of the bending protection layer BPL and the polarization layer POL. The upper adhesive layer UAL may adhere the window member CW on the polarization layer POL and the bending protection layer BPL. For example, the upper adhesive layer UAL may include the pressure sensitive adhesive (PSA), the optically clear adhesive (OCA), the optically clear resin (OCR), or the like. These may be used alone or in combination with each other.

The window member CW may be disposed on the upper adhesive layer UAL. The window member CW may overlap the display area DA. The window member CW may protect the polarization layer POL, the bending protection layer BPL, and the display panel PNL. The window member CW may include reinforced glass, reinforced plastic, or the like. Alternatively, the window member CW may be formed of a single-layer or may have a structure in which a plurality of functional layers are stacked.

The conductive tape CT may be disposed on an upper surface of the printed circuit board PCB. As shown in FIG. 6, when a portion of the display panel PNL overlapping the bending area BA is bent, the conductive tape CT may compensate for a step difference. Alternatively, the conductive tape CT may further include an adhesive material, and the conductive tape CT may be fixed to a lower surface of the functional layer FM. For example, the conductive tape CT may include an anisotropic conductive film or the like.

The cover tape CTP may be disposed on the pad area PA on the driving integrated circuit DIC. In addition, the cover tape CTP may be disposed on a portion of the bending protection layer BPL and a portion of the display panel PNL. In the pad area PA adjacent to the bending area BA, a first end of the cover tape CTP may overlap the bending protection layer BPL, and a second end of the cover tape CTP may overlap the printed circuit board PCB. In other words, the cover tape CTP may cover the driving integrated circuit DIC. For example, the cover tape CTP may include a synthetic resin such as polyethylene terephthalate (PET).

However, the disclosure is not limited thereto, and in another embodiment, the cover tape CTP may contact only a portion of the bending protection layer BPL and a portion of the printed circuit board PCB. In other words, the cover tape CTP may not contact the display panel PNL, and an empty space may be formed between the cover tape CTP and the display panel PNL.

In an embodiment, in the display device 10, one end SP1*a* of the first support part SP1 and one end SP2*a* of the second support part SP2 adjacent to each other may space apart from each other by about 0.4 mm or less in the second direction DR2. Therefore, when the bending area BA of the display device 10 is bent, stress applied to the bending area BA may be reduced. Accordingly, cracks occurring in members overlapping the bending area BA of the display device 10 may be prevented. Accordingly, reliability of the display device 10 may be improved.

Figure 7:
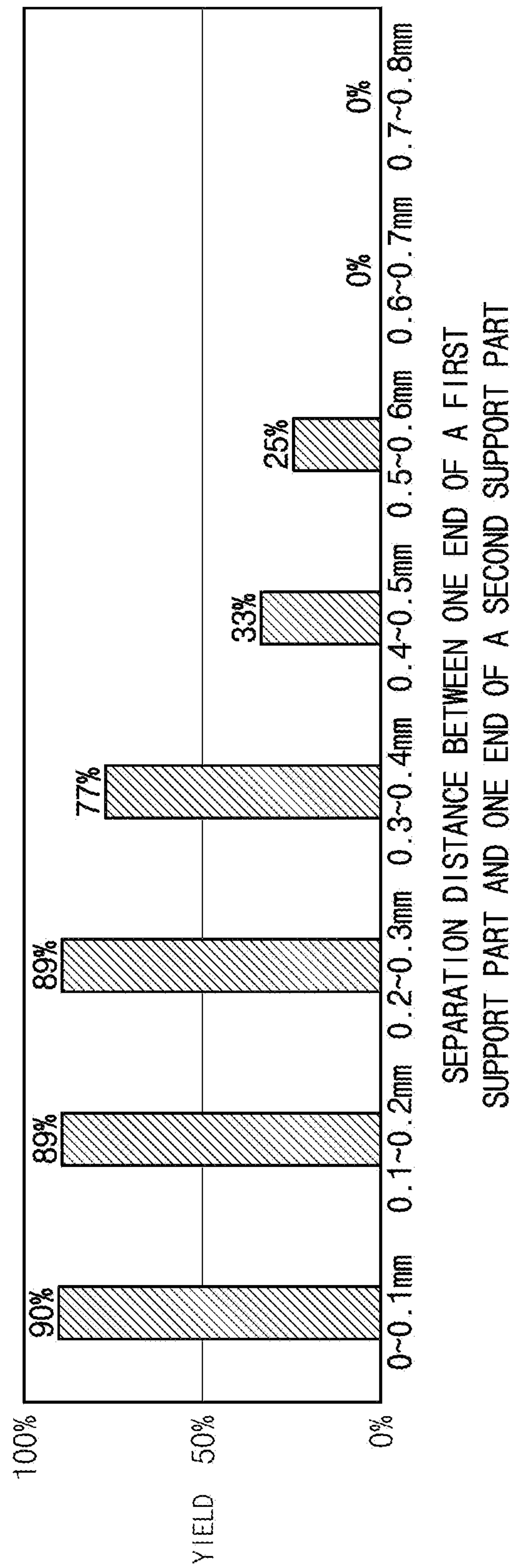
FIG. 7 is a graph illustrating a yield of the display device depending on a separation distance between the one end of the first support part and the one end of the second support part.

FIG. 7 is a graph illustrating a yield of the display device depending on a separation distance between the one end of the first support part and the one end of the second support part.

Referring to FIGS. 6 and 7, an x-axis of the graph may be the separation distance between the one end SP1*a* of the first support part SP1 and the one end SP2*a* of the second support part SP2. In other words, the x-axis may represent the separation distance between one end SP1*a* of the first support part SP1 adjacent to the bending area BA and the one end SP2*a* of the second support part SP2 adjacent to the bending area BA in the second direction DR2. A y-axis of the graph may represent the yield of the display device 10. The yield of the display device 10 may be a ratio of the number of samples treated as a good product to a total number of test samples.

Display devices having a same condition except for the separation distance between the one end SP1*a* of the first support part SP1 and the one end SP2*a* of the second support part SP2 were manufactured. Thereafter, the manufactured display devices were exposed for about 500 hours under conditions of a temperature of about 85° C. and a humidity of about 85%. Under the above conditions, after about 500 hours had elapsed, whether the display devices were normally driven was checked.

As shown in the graph, when the separation distance between the one end SP1*a* of the first support part SP1 and the one end SP2*a* of the second support part SP2 of the display devices corresponding to the embodiment of the disclosure is about 0 to about 0.4 mm or less, the yield of the display devices may be confirmed about 50% or more. For example, when the separation distance between the one end SP1*a* of the first support part SP1 and the one end SP2*a* of the second support part SP2 of the display devices is about 0 mm to about 0.1 mm, the yield of the display devices was about 90%. When the separation distance between the one end SP1*a* of the first support part SP1 and the one end SP2*a* of the second support part SP2 of the display devices is about 0.1 mm to about 0.2 mm, the yield of the display devices was about 89%. When the separation distance between the one end SP a of the first support part SP1 and the one end SP2*a* of the second support part SP2 of the display devices is about 0.2 mm to about 0.3 mm, the yield of the display devices was about 89%. When the separation distance between the one end SP1*a* of the first support part SP1 and the one end SP2*a* of the second support part SP2 of the display devices is about 0.3 mm to about 0.4 mm, the yield of the display devices was about 77%.

On the other hand, when the separation distance between the one end SP1*a* of the first support part SP1 and the one end SP2*a* of the second support part SP2 of the display devices corresponding to a comparative embodiment is about greater than 0.4 mm and less than about 0.8 mm, the yield of the display devices may be confirmed about 50% or less. For example, when the separation distance between the one end SP1*a* of the first support part SP1 and the one end SP2*a* of the second support part SP2 of the display devices is about 0.4 mm to about 0.5 mm, the yield of the display devices is about 33%. When the separation distance between the one end SP1*a* of the first support part SP1 and the one end SP2*a* of the second support part SP2 of the display devices is about 0.5 mm to about 0.6 mm, the yield of the display devices is about 25%. When the separation distance between the one end SP1*a* of the first support part SP1 and the one end SP2*a* of the second support part SP2 of the display devices is about 0.6 mm to about 0.7 mm, the yield of the display devices is about 0%. When the separation distance between the one end SP1*a* of the first support part SP1 and the one end SP2*a* of the second support part SP2 of the display devices is about 0.7 mm to about 0.8 mm, the yield of the display devices is about 0%.

Therefore, as shown in the above graph, based on about 0.4 mm, as the separation distance between the one end SP1*a* of the first support part SP1 and the one end SP2*a* of the second support part SP2 increases, the yield may be significantly decreased. In other words, when the separation distance between the one end SP1*a* of the first support part SP1 and the one end SP2*a* of the second support part SP2 is about 0 to about 0.4 mm or less, the yield of the display device may be improved. Therefore, the reliability of the display device may be improved.

Figure 8:
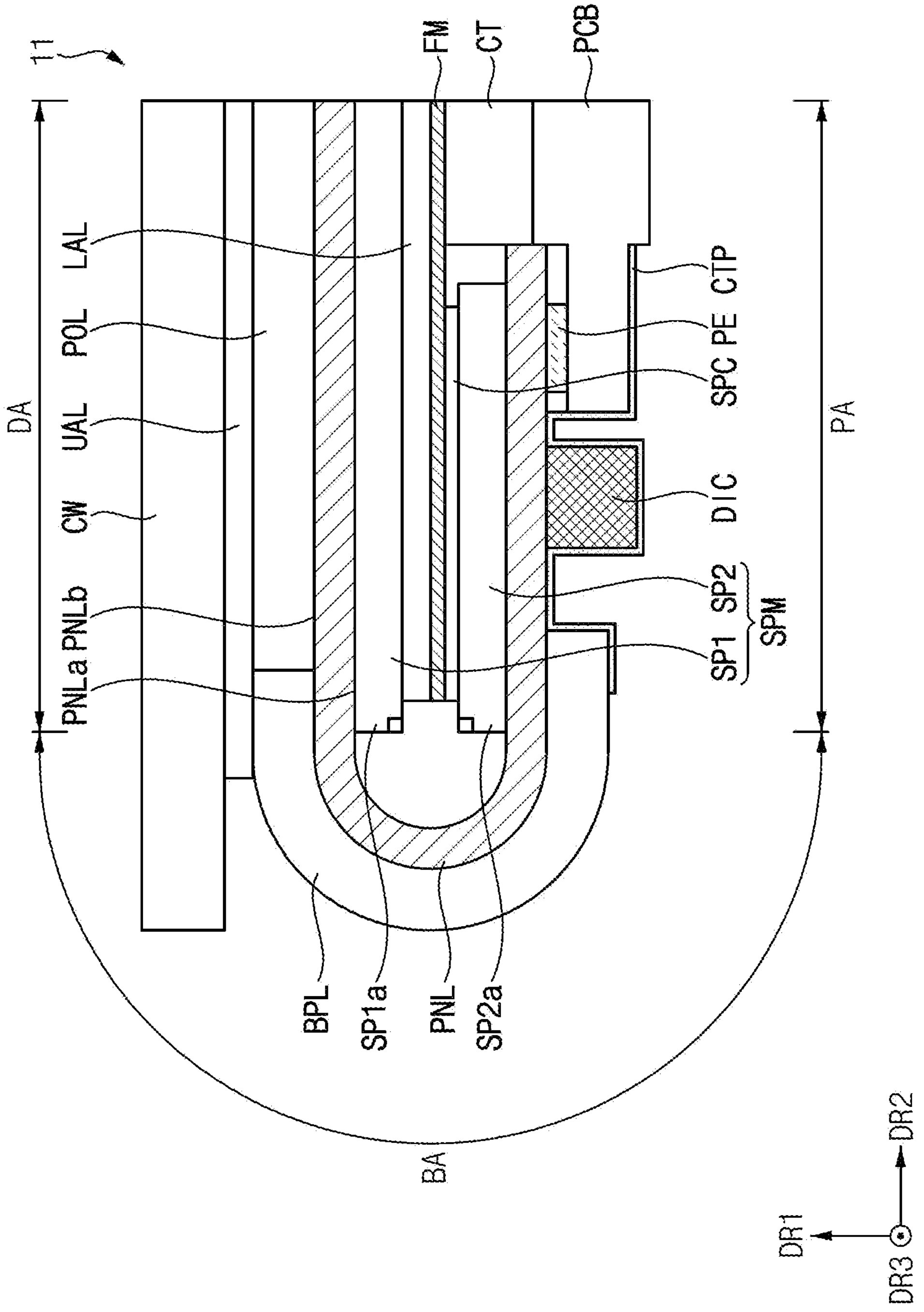
FIG. 8 is a cross-sectional view illustrating another embodiment of FIG. 6.

FIG. 8 is a cross-sectional view illustrating another embodiment of FIG. 6.

For example, a display device 11 described with reference to FIG. 8 may be a same as the display device 10 described with reference to FIGS. 1 to 6 except for a shape of both the first support part and the second support part. Accordingly, redundant descriptions may be omitted or simplified.

Referring to FIG. 8, the display device 11 according to an embodiment of the disclosure may include the display panel PNL, the support member SPM, the lower adhesive layer LAL, the functional layer FM, the polarization layer POL, the upper adhesive layer UAL, the window member CW, the driving integrated circuit DIC, the printed circuit board PCB, the spacer SPC, the bending protection layer BPL, the cover tape CTP, and the conductive tape CT. Here, the display panel PNL may include the pad electrodes PE, and the support member SPM may include the first support part SP1 and the second support part SP2.

The support member SPM may be disposed on the first surface PNLa of the display panel PNL. For example, the first support part SP1 may be disposed in the display area DA on the first surface PNLa of the display panel PNL, and the second support part SP2 may be disposed in the pad area PA on the first surface PNLa of the display panel PNL.

In an embodiment, the first support part SP1 may overlap the display area DA, and the second support part SP2 may overlap the pad area PA. When the display device 11 is bent, the second support part SP2 may be spaced apart from the first support part SP1 in the first direction DR1. In other words, when the display panel PNL is bent in the bending area BA, the first support part SP1 and the second support part SP2 may face each other while overlapping each other.

In an embodiment, the one end SP1*a* of the first support part SP1 adjacent to the bending area BA and the one end SP2*a* of the second support part SP2 adjacent to the bending area BA may overlap each other. For example, the one end SP1*a* of the first support part SP1 adjacent to the bending area BA and the one end SP2*a* of the second support part SP2 adjacent to the bending area BA may be spaced apart from each other by about 0.4 mm or less in the second direction DR2. For example, the one end SP1*a* of the first support part SP1 adjacent to the bending area BA and the one end SP2*a* of the second support part SP2 adjacent to the bending area BA may be positioned on the same line (or substantially the same line) in the first direction DR1.

In an embodiment, each of the side surface of the one end SP1*a* of the first support part SP1 and the side surface of the one end SP2*a* of the second support part SP2 may be substantially orthogonal to the first surface PNLa of the display panel PNL. In other words, the angle formed between the side surface of the one end SP1*a* of the first support part SP1 and the side surface of the one end SP2*a* of the second support part SP2 and the first surface PNLa of the display panel PNL may be about 90 degrees.

Figure 9:
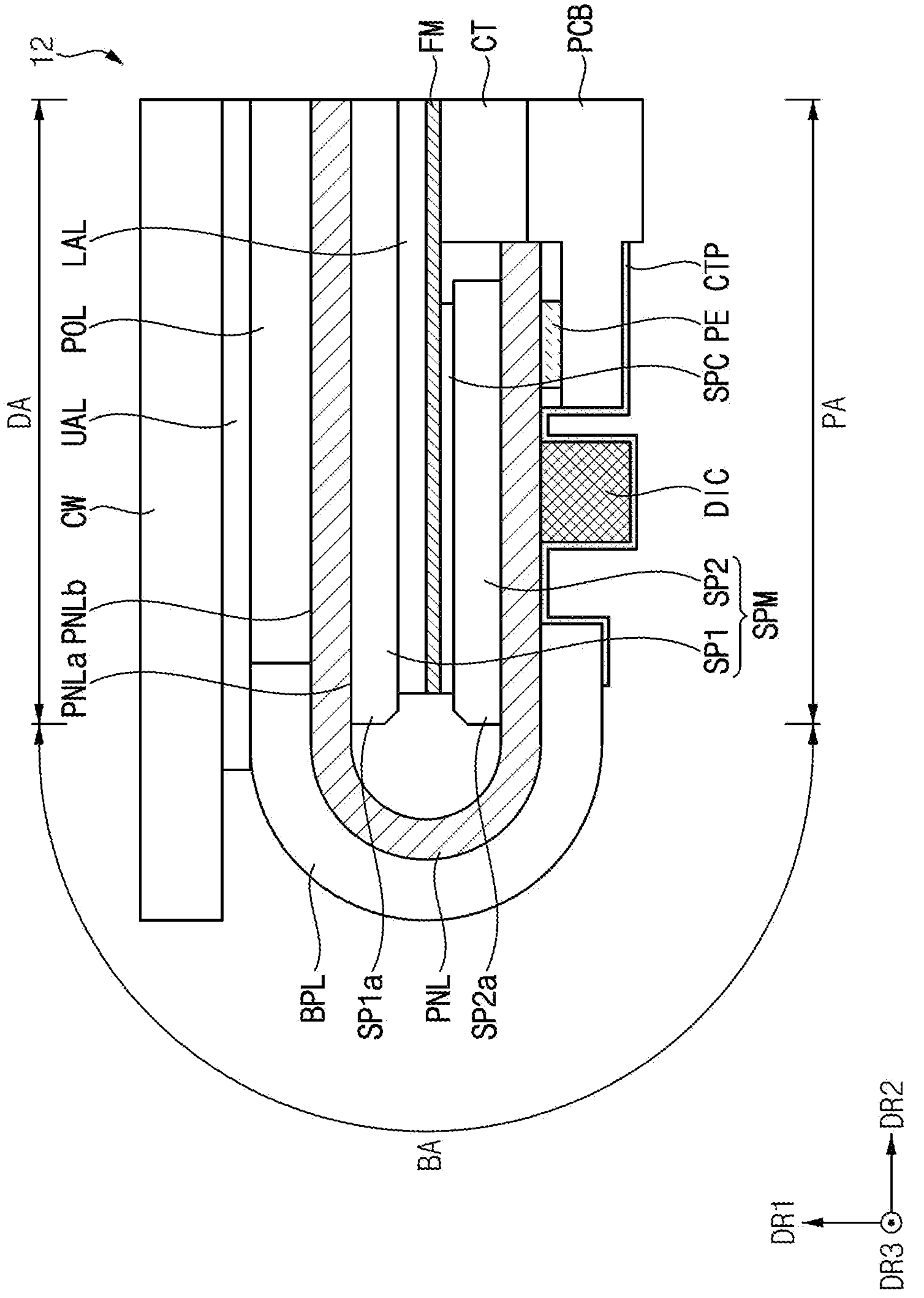
FIG. 9 is a cross-sectional view illustrating another embodiment of FIG. 6.

FIG. 9 is a cross-sectional view illustrating another embodiment of FIG. 6.

For example, a display device 12 described with reference to FIG. 9 may be a same as the display device 10 described with reference to FIGS. 1 to 6 except for the shape of the first support part and the second support part. Accordingly, redundant descriptions may be omitted or simplified.

Referring to FIG. 9, the display device 12 according to an embodiment of the disclosure may include the display panel PNL, the support member SPM, the lower adhesive layer LAL, the functional layer FM, the polarization layer POL, the upper adhesive layer UAL, the window member CW, the driving integrated circuit DIC, the printed circuit board PCB, the spacer SPC, the bending protection layer BPL, the cover tape CTP, and the conductive tape CT. Here, the display panel PNL may include the pad electrodes PE, and the support member SPM may include the first support part SP1 and the second support part SP2.

In an embodiment, the one end SP1*a* of the first support part SP1 adjacent to the bending area BA and the one end SP2*a* of the second support part SP2 adjacent to the bending area BA may overlap each other. For example, the one end SP1*a* of the first support part SP1 adjacent to the bending area BA and the one end SP2*a* of the second support part SP2 adjacent to the bending area BA may be spaced apart from each other by about 0.4 mm or less in the second direction DR2. For example, the one end SP1*a* of the first support part SP1 adjacent to the bending area BA and the one end SP2*a* of the second support part SP2 adjacent to the bending area BA may be positioned on the same line (or substantially the same line) in the first direction DR1.

In an embodiment, each of the one end SP1*a* of the first support part SP1 and the one end SP2*a* of the second support part SP2 may include at least two surfaces extending in different directions. In other words, each of a cross-section of the one end SP1*a* of the first support part SP1 and a cross-section of the one end SP2*a* of the second support part SP2 may have a chamfered quadrangular shape. In this case, a corner of the first support part SP1 and a corner of the second support part SP2 facing each other may be chamfered.

Figure 10:
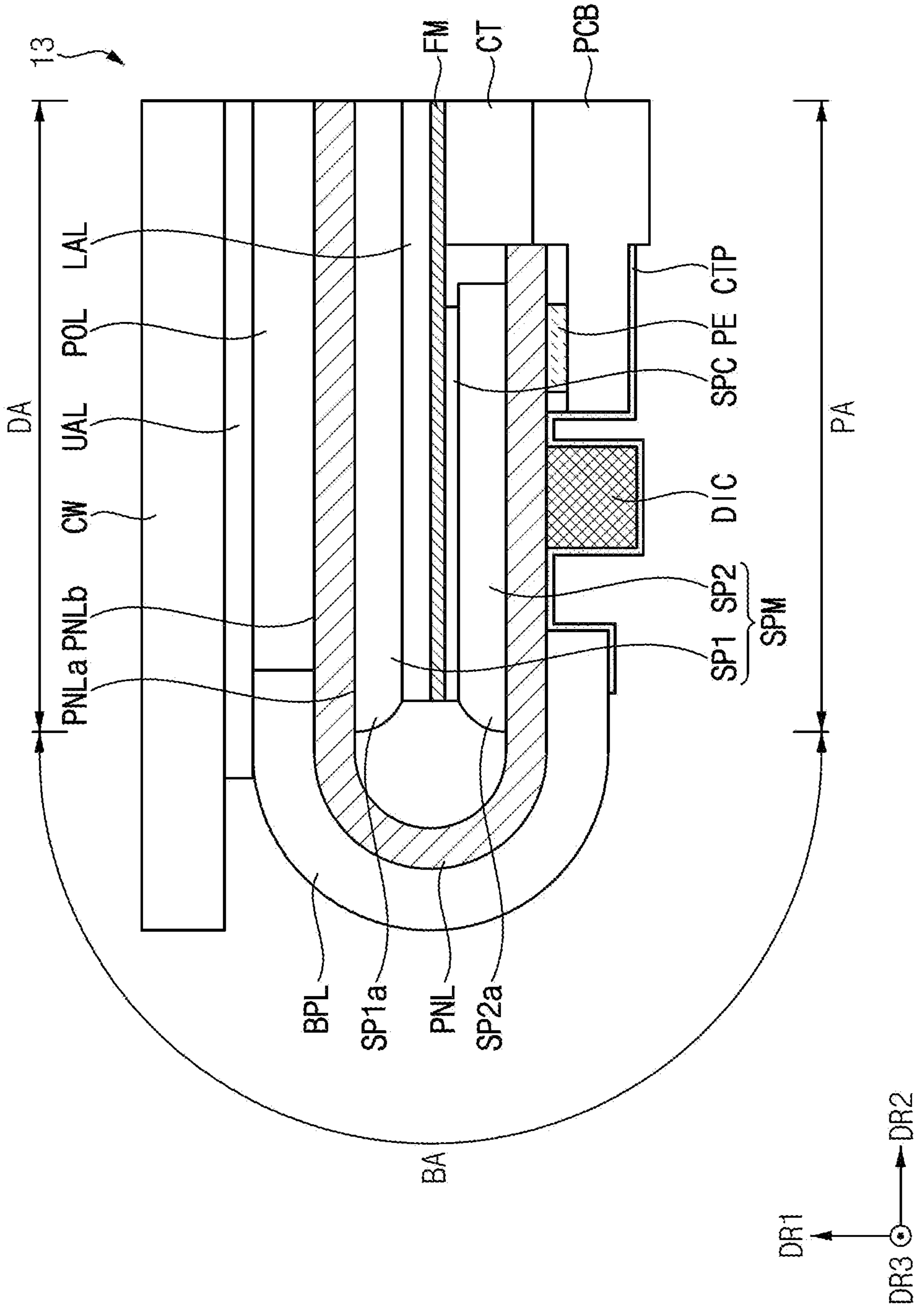
FIG. 10 is a cross-sectional view illustrating another embodiment of FIG. 6.

FIG. 10 is a cross-sectional view illustrating another embodiment of FIG. 6.

For example, a display device 13 described with reference to FIG. 10 may be a same as the display device 10 described with reference to FIGS. 1 to 6 except for the shape of the first support part and the second support part. Accordingly, redundant descriptions may be omitted or simplified.

Referring to FIG. 10, the display device 13 according to an embodiment of the disclosure may include the display panel PNL, the support member SPM, the lower adhesive layer LAL, the functional layer FM, the polarization layer POL, the upper adhesive layer UAL, the window member CW, the driving integrated circuit DIC, the printed circuit board PCB, the spacer SPC, the bending protection layer BPL, the cover tape CTP, and the conductive tape CT. Here, the display panel PNL may include the pad electrodes PE, and the support member SPM may include the first support part SP1 and the second support part SP2.

In an embodiment, the one end SP1*a* of the first support part SP1 adjacent to the bending area BA and the one end SP2*a* of the second support part SP2 adjacent to the bending area BA may overlap each other. For example, the one end SP1*a* of the first support part SP1 adjacent to the bending area BA and the one end SP2*a* of the second support part SP2 adjacent to the bending area BA may be spaced apart from each other by about 0.4 mm or less in the second direction DR2.

In an embodiment, each of the side surface of the one end SP1*a* of the first support part SP1 and the side surface of the one end SP2*a* of the second support part SP2 may have a curved shape in at least one area. In this case, the curved surface may have a shape of a convex curved surface.

Figure 11:
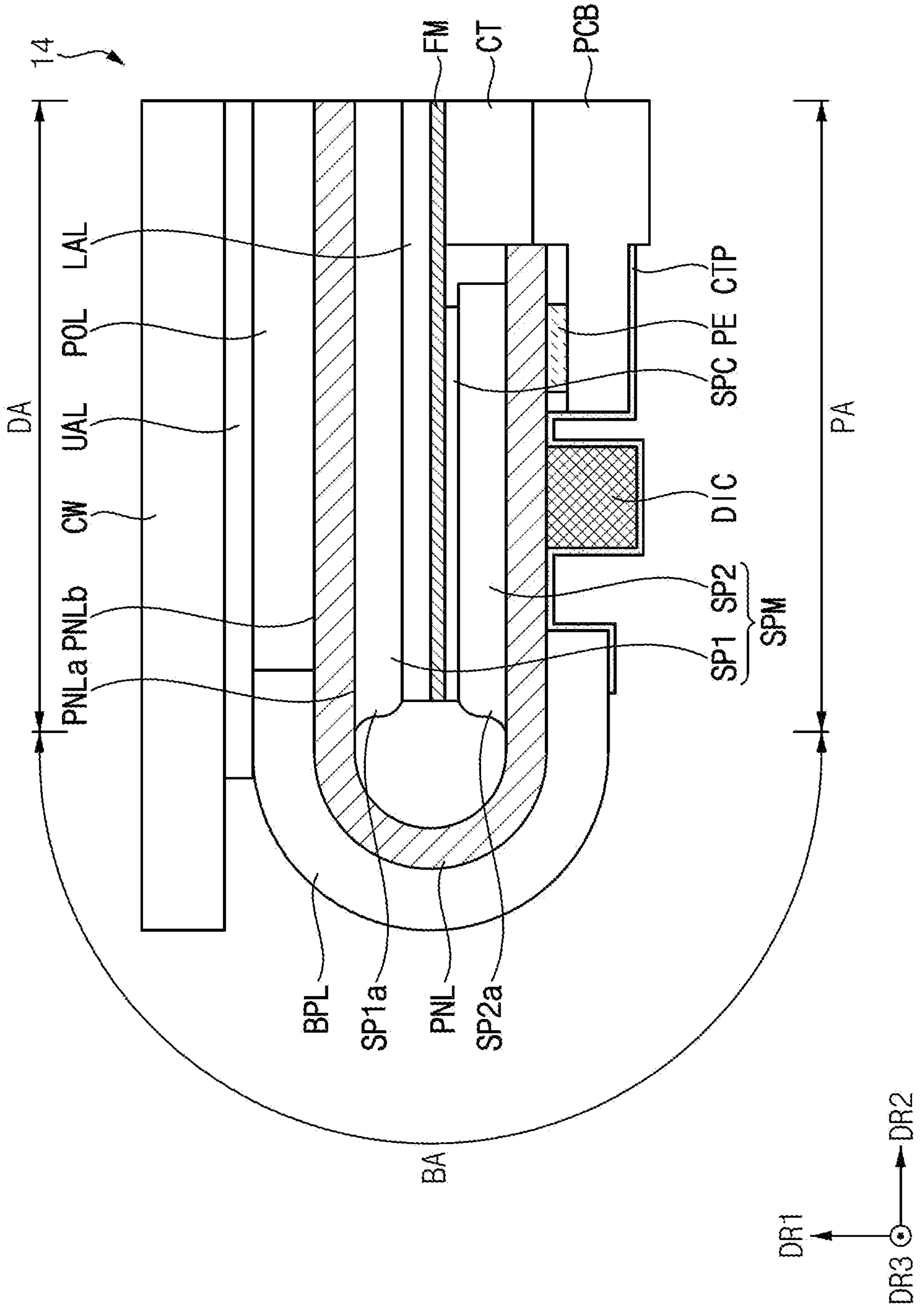
FIG. 11 is a cross-sectional view illustrating another embodiment of FIG. 6.

FIG. 11 is a cross-sectional view illustrating another embodiment of FIG. 6.

For example, a display device 14 described with reference to FIG. 10 may be a same as the display device 10 described with reference to FIGS. 1 to 6 except for the shape of the first support part and the second support part. Accordingly, redundant descriptions may be omitted or simplified.

Referring to FIG. 11, the display device 14 according to an embodiment of the disclosure may include the display panel PNL, the support member SPM, the lower adhesive layer LAL, the functional layer FM, the polarization layer POL, the upper adhesive layer UAL, the window member CW, the driving integrated circuit DIC, the printed circuit board PCB, the spacer SPC, the bending protection layer BPL, the cover tape CTP, and the conductive tape CT. Here, the display panel PNL may include the pad electrodes PE, and the support member SPM may include the first support part SP1 and the second support part SP2.

In an embodiment, the one end SP1*a* of the first support part SP1 adjacent to the bending area BA and the one end SP2*a* of the second support part SP2 adjacent to the bending area BA may overlap each other. For example, the one end SP1*a* of the first support part SP1 adjacent to the bending area BA and the one end SP2*a* of the second support part SP2 adjacent to the bending area BA may be spaced apart from each other by about 0.4 mm or less in the second direction DR2.

In an embodiment, each of the side surface of the one end SP1*a* of the first support part SP1 and the side surface of the one end SP2*a* of the second support part SP2 may have the curved shape in at least one area. In this case, the curved surface may have a shape of a curved surface convex in different directions. For example, a shape of the curved surface may have an S-shape in the cross sectional view.

The display device according to embodiments of the disclosure may be applied to a display device included in a computer, a laptop, a mobile phone, a smart phone, a smart pad, an automobile, a PMP, a PDA, a MPE, and the like.

Although embodiments of the disclosure have been described with reference to the accompanying drawings, the illustrated embodiments are examples, and may be modified and/or changed by a person with ordinary knowledge in the relevant technical field without departing from the scope of the disclosure set forth in the following claims.

What is claimed is:

1. A display device comprising:

a display panel including a display area, a pad area spaced apart from the display area, and a bending area between the display area and the pad area;

a first support part overlapping the display area; and a second support part overlapping the pad area, wherein the second support part is spaced apart from the first support part in a first direction when the bending area is bent, and wherein a first end of the first support part adjacent to the bending area and a first end of the second support part adjacent to the bending area are spaced apart from each other by about 0.4 mm or less in a second direction crossing the first direction when the bending area is bent thereby reducing an occurrence of cracks in the bending area.

2. The display device of claim 1, wherein each of the first support part and the second support part includes glass.

3. The display device of claim 1, wherein the first support part and the second support part overlap each other and face each other when the bending area is bent.

4. The display device of claim 1, further comprising:

a driving integrated circuit disposed on the display panel and overlapping the pad area.

5. The display device of claim 1, further comprising:

a printed circuit board connected to the display panel in the pad area.

6. The display device of claim 1, further comprising:

a functional layer disposed between the first support part and the second support part.

7. The display device of claim 1, wherein the display panel includes a first surface contacting the first and second support parts and a second surface opposite to the first surface.

8. The display device of claim 7, wherein each of a side surface of the first end of the first support part and a side surface of the first end of the second support part is perpendicular to the first surface of the display panel.

9. The display device of claim 1, wherein each of the first end of the first support part and the first end of the second support part includes at least two surfaces extending in different directions from each other.

10. The display device of claim 1, wherein each of the side surface of the first end of the first support part and the side surface of the first end of the second support part has a curved shape.

11. The display device of claim 10, wherein the curved shape is an S-shape in a cross section.

12. The display device of claim 1, further comprising:

a polarization layer disposed on the display panel and overlapping the display area.

13. The display device of claim 12, further comprising:

an adhesive layer disposed on the polarization layer and overlapping the display area.

14. The display device of claim 13, further comprising:

a window member disposed on the adhesive layer and overlapping the display area.

15. The display device of claim 1, further comprising:

a bending protection layer disposed on the display panel and overlapping the bending area.

16. The display device of claim 1, further comprising:

a substrate extending from the display area to the pad area.

17. The display device of claim 16, wherein the substrate includes an organic material.

18. The display device of claim 16, wherein the display panel further includes:

a circuit element layer disposed in the display area on the substrate and including at least one transistor;

a light emitting diode layer disposed in the display area on the circuit element layer and including at least one light emitting diode; and an encapsulation layer disposed on the light emitting diode layer.

19. A display device comprising:

a display panel including a display area, a pad area spaced apart from the display area, and a bending area between the display area and the pad area;

a first support part overlapping the display area; and a second support part overlapping the pad area, wherein:

the second support part is spaced apart from the first support part in a first direction when the bending area is bent, the display panel includes a first surface contacting the first and second support parts and a second surface opposite to the first surface, and an entirety of each of a side surface of the first end of the first support part and a side surface of the first end of the second support part has a tapered shape.

20. A display device comprising:

a display panel including a display area, a pad area, and a bending area between the display area and the pad area;

a first support part disposed on the display panel and overlapping the display area; and a second support part disposed on the display panel and overlapping the pad area, wherein the second support part is spaced apart from the first support part in a second direction when the display panel is in a flat state, and when the display panel is bent the first support part and the second support part face each other in a first direction crossing the second direction and a first end of the first support part adjacent to the bending area and a first end of the second support part adjacent to the bending area are spaced apart from each other by about 0.4 mm or less in the second direction thereby reducing an occurrence of cracks in the bending area.

* * * * *